(12) United States Patent
Ring et al.

(10) Patent No.: US 9,530,647 B2
(45) Date of Patent: Dec. 27, 2016

(54) DEVICES INCLUDING ULTRA-SHORT GATES AND METHODS OF FORMING SAME

(71) Applicant: Cree, Inc., Durham, NC (US)

(72) Inventors: Zoltan Ring, Chapel Hill, NC (US); Dan Namishia, Wake Forest, NC (US)

(73) Assignee: Cree, Inc., Durham, NC (US)

( * ) Notice: Subject to any disclaimer, the term of this patent is extended or adjusted under 35 U.S.C. 154(b) by 3 days.

(21) Appl. No.: 14/036,799

(22) Filed: Sep. 25, 2013

(65) Prior Publication Data

US 2015/0084116 A1 Mar. 26, 2015

(51) Int. Cl.
| | |
|---|---|
| *H01L 21/8234* | (2006.01) |
| *H01L 21/04* | (2006.01) |
| *H01L 21/285* | (2006.01) |
| *H01L 21/443* | (2006.01) |
| *H01L 21/311* | (2006.01) |
| *H01L 29/423* | (2006.01) |
| *H01L 21/28* | (2006.01) |
| *H01L 29/66* | (2006.01) |
| *H01L 29/20* | (2006.01) |

(52) U.S. Cl.
CPC ......... *H01L 21/049* (2013.01); *H01L 21/0495* (2013.01); *H01L 21/28587* (2013.01); *H01L 21/31116* (2013.01); *H01L 21/443* (2013.01); *H01L 29/66621* (2013.01); *H01L 29/66863* (2013.01); *H01L 21/28114* (2013.01); *H01L 21/28123* (2013.01); *H01L 29/2003* (2013.01); *H01L 29/42376* (2013.01); *H01L 29/6656* (2013.01); *H01L 29/66553* (2013.01)

(58) Field of Classification Search
CPC .................. H01L 21/28114; H01L 21/28123; H01L 29/42376; H01L 29/66553; H01L 29/6656
USPC .................................................. 257/287, 288
See application file for complete search history.

(56) References Cited

U.S. PATENT DOCUMENTS

| | | | | |
|---|---|---|---|---|
| 6,159,781 A | * | 12/2000 | Pan | H01L 21/28114 257/E21.205 |
| 6,864,148 B1 | * | 3/2005 | Hsiao | H01L 29/42368 257/E21.251 |
| 8,084,346 B1 | * | 12/2011 | Guo et al. | 438/595 |
| 2003/0129818 A1 | * | 7/2003 | Inai et al. | 438/595 |
| 2004/0137688 A1 | * | 7/2004 | Chang | H01L 21/28061 438/303 |
| 2005/0142823 A1 | * | 6/2005 | Cho | 438/585 |
| 2005/0233523 A1 | * | 10/2005 | Wu et al. | 438/264 |
| 2006/0128106 A1 | * | 6/2006 | Ho | H01L 21/28114 438/305 |
| 2008/0149989 A1 | * | 6/2008 | Cheng | H01L 27/115 257/316 |
| 2009/0189201 A1 | * | 7/2009 | Chang | H01L 29/66545 257/288 |
| 2012/0223394 A1 | * | 9/2012 | Toh et al. | 257/384 |
| 2012/0264279 A1 | * | 10/2012 | Lu | H01L 29/4966 438/585 |

(Continued)

*Primary Examiner* — George Fourson, III
(74) *Attorney, Agent, or Firm* — Myers Bigel, P.A.

(57) ABSTRACT

Provided are devices including ultra-short gates and methods of forming same. Methods include forming a first gate pattern on a semiconductor that includes a first recess having a first width. A dielectric spacer is formed on a sidewall of the first recess to define a second recess in the first recess that has a second width that is smaller than the first width. A gate having the second width is formed in the second recess.

23 Claims, 7 Drawing Sheets

(56) References Cited

U.S. PATENT DOCUMENTS

2016/0087075 A1* 3/2016 Zhang .............. H01L 29/66545
257/412

* cited by examiner

DEVICES INCLUDING ULTRA-SHORT GATES AND METHODS OF FORMING SAME

BACKGROUND

Semiconductor devices may be developed at increasingly smaller scales and increasingly higher density of components therein. For example, gates and other small features on advanced devices may benefit from increasingly smaller manufacturing dimensions. Photolithography is a semiconductor device fabrication technique that may be used to define and/or form gates and or other devices. However, a lower limit on the width of the gate or any other device when defined by photolithography may be restricted to the wavelength of light, or about 0.35 to 0.40 microns.

Although this limitation may be overcome using various advanced lithography methods, such as, for example, beam lithography, such advanced lithography methods may necessitate expensive capital equipment and maybe costly to fabricate.

SUMMARY

Some embodiments of the present invention are directed to methods of forming a semiconductor device. Some embodiments according to such methods may include forming a first gate pattern on a semiconductor that includes a first recess having a first width, forming a dielectric spacer on a sidewall of the first recess to define a second recess in the first recess that has a second width that is smaller than the first width and forming a gate having the second width in the second recess.

In some embodiments, the first width is greater than about 0.3 µm. Some embodiments provide that the second width is less than about 0.25 µm. In some embodiments, the second width is in a range of about 0.05 µm to about 0.25 µm. Some embodiments provide that the second width is in a range of about 0.10 µm to about 0.20 µm.

Some embodiments provide that forming the first gate pattern includes forming a photolithography pattern on the semiconductor and stripping the photolithography pattern using a dry etch process and/or a wet etch process. In some embodiments, the dry etch process includes a reactive ion etch and/or inductively coupled plasma. Some embodiments include, before forming the first gate pattern, depositing a passivation layer on the semiconductor. The first recess may be formed in the passivation layer and may expose the semiconductor therethrough.

In some embodiments, forming the dielectric spacer on the sidewall of the first recess includes depositing a dielectric spacer layer on the semiconductor including the first gate pattern, the dielectric spacer layer being formed on a top surface of the semiconductor and on surfaces of the first recess, and performing a dry etch process to remove the dielectric spacer layer from the top surface of the semiconductor and from a portion of the first recess to define the second recess. Some embodiments provide that the second recess is bounded by the dielectric spacer on a sidewall of the first recess and a bottom surface of the first recess. Some embodiments include depositing a carbon based polymer on a side wall of the dielectric spacer by using a fluorine carbon gas having a carbon to fluorine ratio that is equal to or greater than about 1:2. In some embodiments, the dielectric spacer layer includes SiO and the dry etch includes a fluorine dry reactive ion etch and/or inductively coupled plasma.

Some embodiments provide that depositing the dielectric spacer layer includes performing plasma enhanced chemical vapor deposition using a SiH4/N2O plasma at a temperature of about 350 degrees Celsius. Some embodiments include cryogenically cooling the semiconductor. The dry etch process may be performed on the cryogenically cooled semiconductor. In some embodiments, the dielectric spacer layer includes SiN and the dry etch includes a chlorine reactive ion etch and/or inductively coupled plasma. Some embodiments provide that a thickness of the dielectric spacer layer includes about one half of the second width. In some embodiments, a thickness of the dielectric spacer layer includes range of about 60 percent of the second width to about 80 percent of the second width.

Some embodiments provide that forming the gate having the second width in the second recess includes forming a gate oxide layer on a bottom surface of the second recess and forming a gate metallization pattern in the second recess.

Some embodiments of the present invention are directed to devices that include a semiconductor including a gate recess that is defined by a sidewall including a dielectric spacer and a bottom surface of a preliminary recess and that includes a recess width that is less than about 0.25 µm. In some embodiments, the preliminary recess includes a width that is greater than about 0.3 µm. Some embodiments provide that the preliminary recess is formed using a dry etch process on a photolithography pattern on the semiconductor. In some embodiments, the recess width is in a range of about 0.05 µm to about 0.25 µm. Some embodiments provide that the recess width is in a range of about 0.10 µm to about 0.20 µm.

Some embodiments include a passivation layer on the semiconductor. The gate recess may be formed in the passivation layer and expose the semiconductor therethrough. In some embodiments, the dielectric spacer includes a top surface that is lower than a height of a sidewall of the preliminary recess. Some embodiments provide that the dielectric spacer is formed from a dielectric spacer layer that includes SiO and that is dry etched using a fluorine dry reactive ion etch and/or inductively coupled plasma. In some embodiments, the dielectric spacer is formed from a dielectric spacer layer that includes SiN and that is dry etched using a chlorine dry reactive ion etch and/or inductively coupled plasma.

Some embodiments include a gate formed in the gate recess that has the recess width. In some embodiments, the gate includes a gate oxide layer on a bottom surface of the gate recess and a gate metallization pattern in the gate recess.

Some embodiments include a carbon based polymer deposited on a side wall of the dielectric spacer using a fluorine carbon gas having a carbon to fluorine ratio greater than or equal to about 1:2.

These and other features of the present invention will become more readily apparent to those skilled in the art upon consideration of the following detailed description and accompanying drawings, which describe both preferred and alternative embodiments of the present invention.

DETAILED DESCRIPTION

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention.

The terminology used in the description of the invention herein is for the purpose of describing particular embodiments only and is not intended to be limiting of the invention. As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation, of for example, light elements such as boron and/or beryllium, may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms used in disclosing embodiments of the invention, including technical and scientific terms, have the same meaning as commonly understood by one of ordinary skill in the art to which this invention belongs, and are not necessarily limited to the specific definitions known at the time of the present invention being described. Accordingly, these terms can include equivalent terms that are created after such time. It will be further understood that terms, such as those defined in commonly used dictionaries, should be interpreted as having a meaning that is consistent with their meaning in the present specification and in the context of the relevant art and will not be interpreted in an idealized or overly formal sense unless expressly so defined herein. All publications, patent applications, patents, and other references mentioned herein are incorporated by reference in their entirety.

The following disclosure may be implemented in a silicon carbide (SiC) material system as well as other material systems, such as the gallium nitride (GaN), gallium arsenide (GaAs), zinc oxide (ZnO) material systems, and the like. Further, reference to a particular compound is considered to include the primary compound as well as any ternary and quaternary compounds of the primary compound. For example, a reference to a gallium nitride-based compound or structure is considered to include gallium nitride (GaN) as well as any of its ternary and quaternary compounds, such as but not limited to aluminum (Al) and indium (In). As such, a gallium nitride-based compound or structure may include any combination of gallium nitride (GaN), aluminum gallium nitride (AlGaN), or indium gallium nitride (InGaN) layers. Compounds from different material systems may be included in given structure. Further, stating a particular layer or material is formed from a particular compound, such as titanium nitride (TiN), does not preclude the presence of other elements or compounds in that layer or material, but should be interpreted to at least include the option for the layer or material to also consist essentially of the compound.

As disclosed herein, the fabrication of short gates without the use of advanced photolithography approaches may be accomplished using stepper photolithography in combination with a spacer etch process. Some embodiments provide that the spacer etch process disclosed herein may use complimentary combinations of spacer dielectric and dry etch chemistries to maximize the anisotropy of the etch and thus minimize gate dimension.

Figure 1:
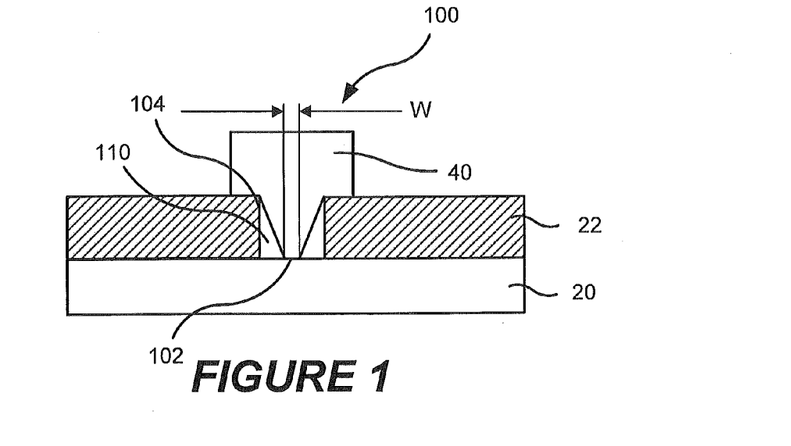
FIG. 1 is a schematic block diagram of a device structure that can be fabricated in accordance with some embodiments.

Reference is now made to FIG. 1 is a schematic block diagram of a device structure that can be fabricated in accordance with some embodiments disclosed herein. The device may include a semiconductor 20 that includes a passivation layer 22 formed thereon. A gate 40 may be formed in a gate recess 100 that has a recess width W of less than about 0.25 µm. In some embodiments, the gate recess 100 may be defined by a dielectric spacer 110 that is formed on one or more sidewalls 104 of the semiconductor 20 and/or the passivation layer 22 and by a bottom surface of a preliminary recess that is formed in the semiconductor 20 and/or the passivation layer 22. In some embodiments, the preliminary recess may include a width that is greater than about 0.3 µm.

Figure 2A:
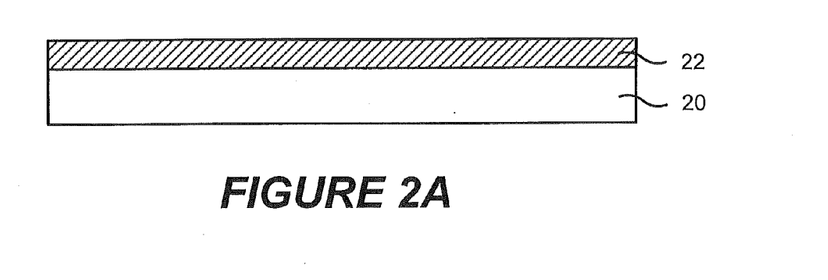
FIGS. 2A-2F are schematic block diagrams illustrating operations for manufacturing devices according to some embodiments disclosed herein.

Reference is now made to FIGS. 2A-2F, which are schematic block diagrams illustrating operations for manufacturing devices according to some embodiments disclosed herein. Referring to FIG. 2A, a passivation layer 22 may be formed on a semiconductor 20. Some embodiments provide that the passivation layer 22 may be deposited using one or more thin-film deposition processes, such as evaporation, sputtering and/or plasma-enhanced chemical vapor deposition (PECVD), among others. Deposition processes, such as PECVD, sputtering and evaporation processes, may be used to form thin films and/or layers of a desired material over given surface.

A PECVD process may be used to deposit thin films from a gas state to a solid state on a substrate via chemical reactions which occur after the creation of a plasma with the reacting gases. An evaporation process may entail of operating the material and/or materials desired for a given layer in a vacuum of the resulting vapor particles. When the particles contact the surface on which the layer is to be applied, the vapor particles condense into a solid state to gradually form a layer of the desired material or materials. An evaporation process may be different than the sputtering process for depositing layers. Sputtering processes may employ ionized gas molecules to displace atoms of the specified material. The displaced atoms bond at an atomic level to the exposed surface and create a layer on the exposed surface.

Figure 2B:
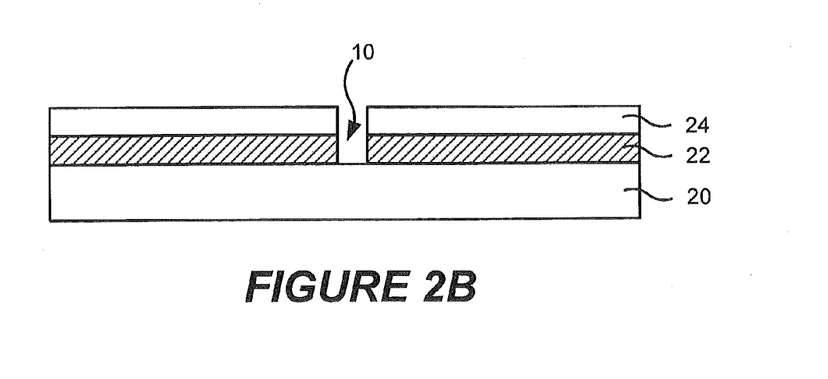

Referring to FIG. 2B, a photolithography pattern 24 is formed on the passivation layer 22. The photolithography pattern 24 may be formed using standard lithography and may yield a preliminary recess having a 0.3 to 0.4 μm width. Although not illustrated in the current embodiment, the photolithography pattern 24 may be formed directly on the semiconductor 20 and/or on the passivation layer 22. A pattern including the preliminary recess 10 may be produced on the passivation layer 22 and/or the semiconductor 20 by performing a dry etch. The dry etch may include a reactive ion etch (RIE) and/or inductively coupled plasma (ICP), among others.

Figure 2C:
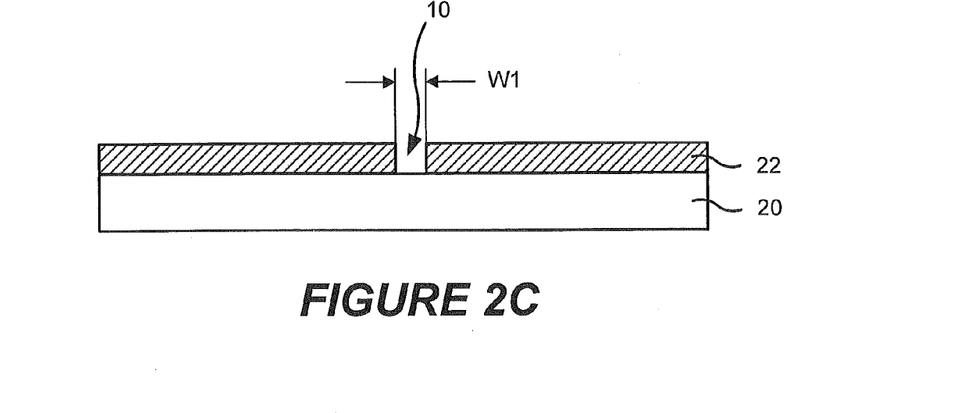

Briefly referring to FIG. 2C, the photolithography pattern 24 may be stripped off of the top surface of the passivation layer 22 and/or semiconductor 20. For example, a dry etch process may be used to strip the photolithography pattern 24. In this manner, the preliminary recess 10 is formed on the semiconductor 20 and/or the passivation layer 22. Some embodiments provide that the preliminary recess 10 may include a width W1 that is 0.3 to 0.4 μm wide.

Figure 2D:
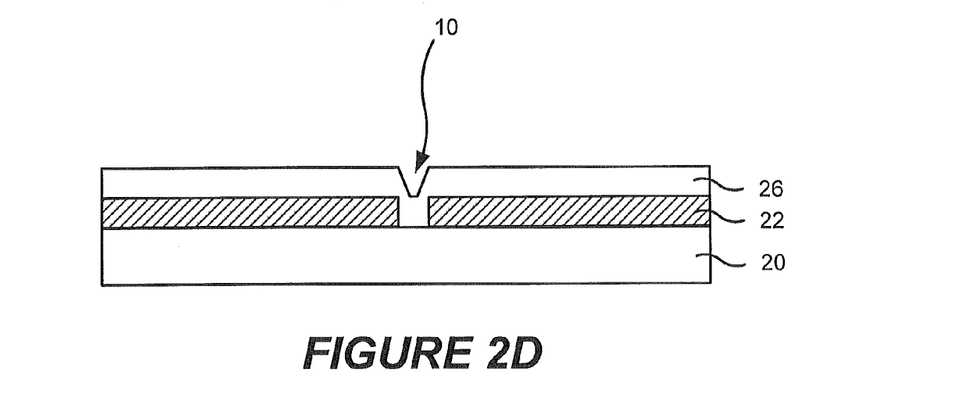

Referring to FIG. 2D, a dielectric spacer layer 26 is deposited on the semiconductor 20 and/or the passivation layer 22. In some embodiments, the dielectric spacer layer 26 may be a plasma enhanced chemical vapor deposition (PECVD) film, an atomic layer deposition (ALD), and/or a plasma enhanced atomic layer deposition (PE-ALD) and may be substantially conformal in that the portion proximate the preliminary recess 10 may be recessed relative to portions on the top surfaces of the semiconductor 20 and/or passivation layer 22. In this regard, the dielectric spacer layer 26 may be formed on a top surface of the semiconductor 20 and/or passivation layer 22 and on surfaces of the preliminary recess 10.

Figure 2E:
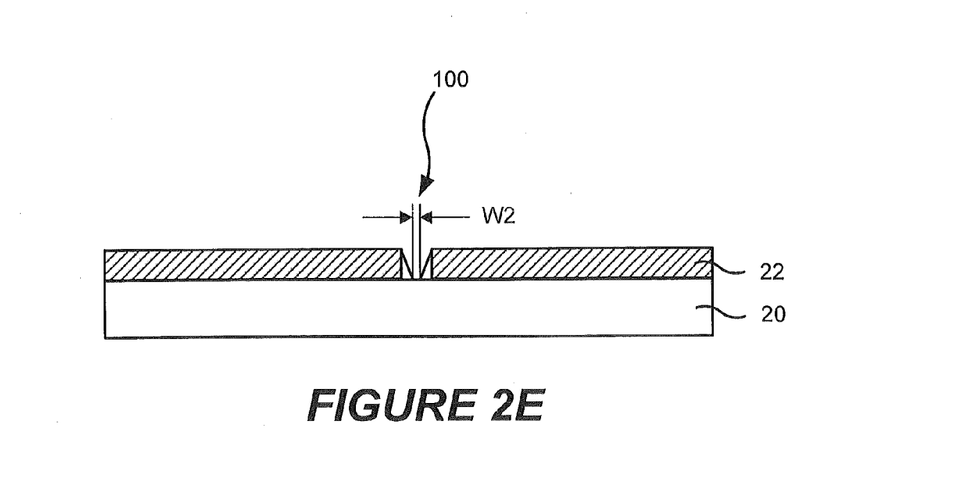

Referring to FIG. 2E, the dielectric spacer layer 26 is etched using a dry etch process that removes the dielectric spacer layer 26 from the top surface of the semiconductor 20 and/or passivation layer 22 and from a portion of the first recess 10. In this manner, a second recess 100 may be formed in the semiconductor 20 and/or passivation layer 22 that has a width W2 that is less than width W1. For example, some embodiments provide that W2 is in a range of about 0.05 μm to about 0.25 μm. In some embodiments, W2 is in a range of about 0.10 μm to about 0.20 μm.

In some embodiments, the dielectric spacer layer 26 includes a PECVD oxide. For example, the dielectric spacer layer 26 may be deposited in a SiH4/N2O plasma at about 350 degrees Celsius. In such embodiments, a fluorine dry reactive ion etch may be used to remove the portions of the dielectric spacer layer 26. An undesirable lateral etch characteristic may be reduced and/or avoided because the thermal activation energy of the PECVD SiO etch reaction in the PECVD oxide is high enough that the lateral etch does not proceed appreciably while the vertical etch proceeds primarily vertically when bombarded by ions.

In some embodiments, the use of a PECVD oxide as a spacer dielectric may be precluded due to its properties in the gate passivating layer. In such embodiments a PECVD nitride may be used as a dielectric spacer. For example, a SiN spacer may have a significantly lower thermal activation with a fluorine etch than that of a SiO. As such, the dry reactive ion etch using fluorine may proceed laterally as well as vertically. In such embodiments, an anisotropic SiN etch may be used to prevent the lateral etch and a subsequent blow out of the gates.

Figure 2F:
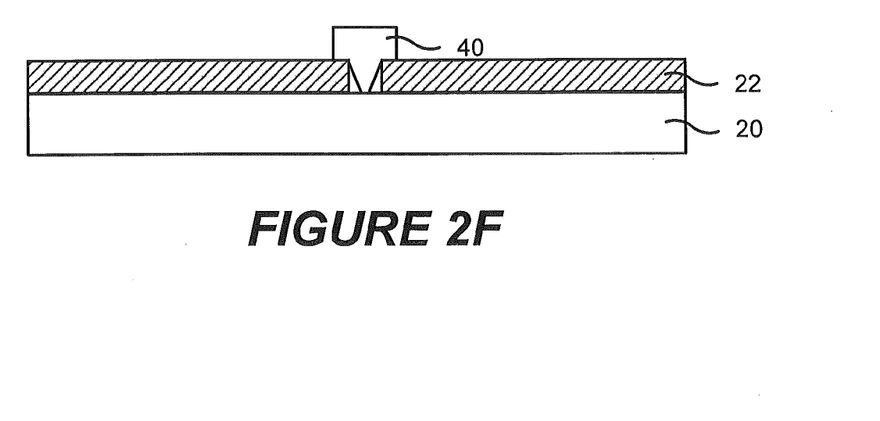

Once the gate recess having the width W2 is provided, referring to FIG. 2F, a gate structure 40 may be formed in the gate recess 100. Although not illustrated, the gate structure 40 may include a gate oxide layer on a bottom surface of the gate recess and a gate metallization pattern formed on the gate oxide layer and in the gate recess 100. For example, the gate structure 40 may extend to a height that is above the height of the top surface of the semiconductor 20 and/or passivation layer 22.

Figure 3A:
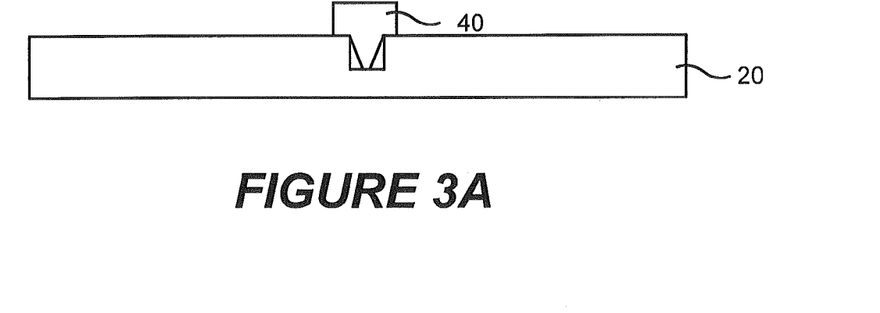
FIGS. 3A-3D are schematic block diagrams illustrating different embodiments of devices disclosed herein.
Figure 3B:
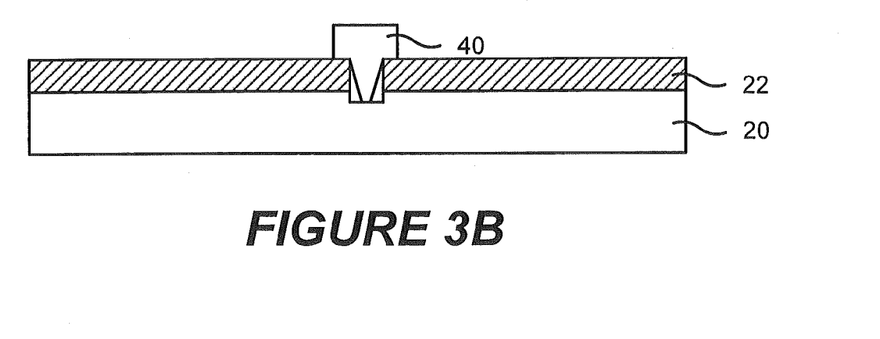

Reference is now made to FIGS. 3A-3D, which are schematic block diagrams illustrating different embodiments of devices disclosed herein. Referring to FIG. 3A, embodiments are illustrated in which the gate recess 100 and short width gate that is formed therein are formed in the semiconductor 20 without a passivation layer. Referring to FIG. 3B, the gate recess 100 and gate structure 40 extend through the passivation layer 22 and into a recess that has a top surface 112 that is lower than the semiconductor 20 top surface.

Figure 3C:
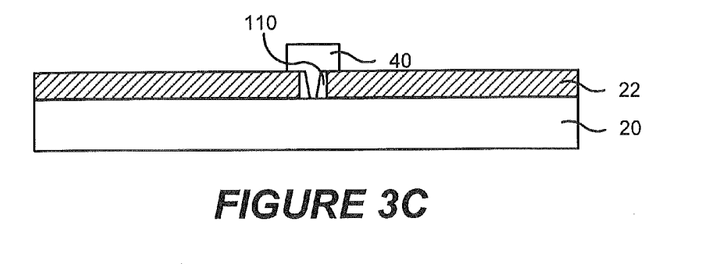
Figure 3D:
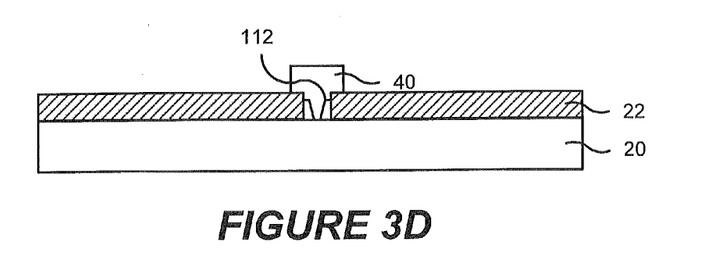

Referring to FIG. 3C, the dielectric spacer 110 includes a top surface that is substantially coplanar with the semiconductor 20 and/or passivation layer 22. Some embodiments provide that a width at the top of the gate recess 100 is less than a width at the top to the preliminary recess 10, while some embodiments provide that a width at the top of the gate recess 100 is about the same as the width of the preliminary recess 10. Referring to FIG. 3D, the dielectric spacer 110 includes a top surface that is below a top of the preliminary recess 10.

Figure 4:
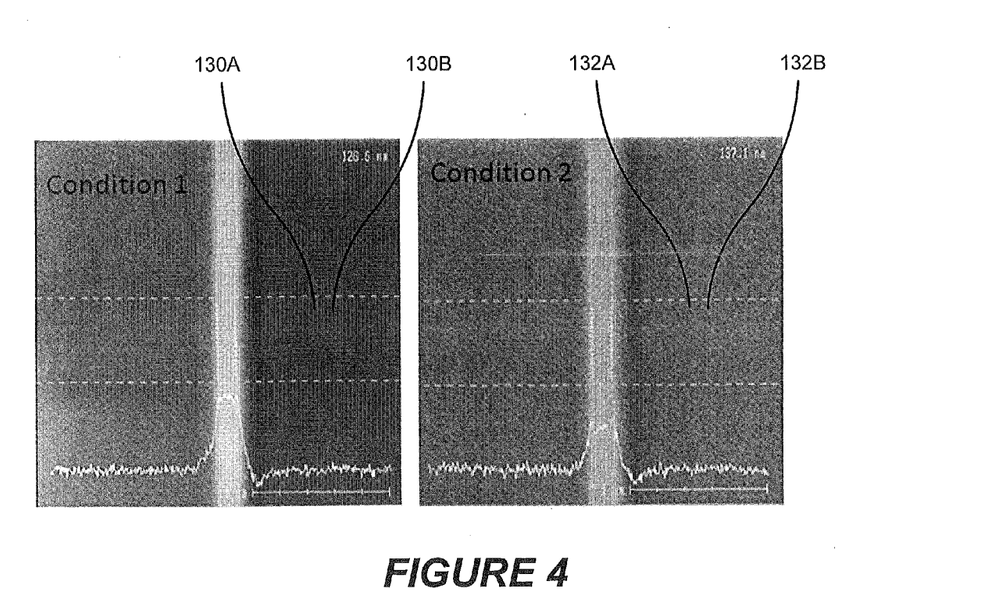
FIG. 4 are magnified images illustrating gate recess widths of devices manufactured under different respective conditions according to some embodiments disclosed herein.

Brief reference is now made to FIG. 4, which illustrates magnified images illustrating gate recess widths of devices manufactured under different respective conditions according to some embodiments disclosed herein. For example, the image labeled Condition 1 measures a gate width between gate recess edges 130A and 130B as 126.6 nm (0.1266 microns). Similarly, the image labeled Condition 2 measures a gate width between gate recess edges 132A and 132B as 137.1 nm (0.1371 microns). The processing of the device labeled as Condition 1 included a photo exposure time of about 240 μseconds. The processing of the device labeled as Condition 2 included a photo exposure time of about 250 μseconds. Thus, the difference in processing between the Condition 1 and Condition 2 devices is about 10 μseconds of photo exposure time to form the preliminary recess. The dry etch time corresponding to each condition was substantially the same.

Figure 5:
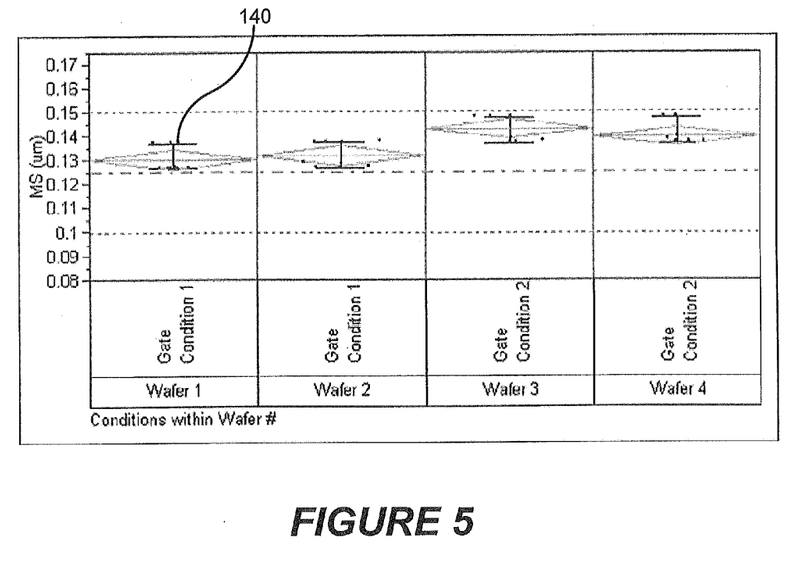
FIG. 5 is a graph of a series of data sets illustrating sample gate width data of devices manufactured according to Conditions 1 and 2 provided in FIG. 4.

Reference is now made to FIG. 5, which is a graph of a series of data sets illustrating sample gate recess width data of devices manufactured according to Conditions 1 and 2 provided in FIG. 4. The vertical axis of the graph corresponds to a width across the bottom of a recess formed in devices under Conditions 1 and 2. Each width data point 140 corresponds to a width at the bottom of a recess. For example, the columns identified as Wafers 1 and 2 include width data of the recesses in two different wafers processed according to the Condition 1, as discussed above regarding FIG. 4. Note that each of the data sets corresponding to Wafers 1 and 2 indicate recess widths that are dimensionally consistent with one another. Similarly, the columns identified as Wafers 3 and 4 include width data of the recesses in two different wafers processed according to the Condition 2, as discussed above regarding FIG. 4. Note that each of the data sets corresponding to Wafers 3 and 4 indicate recess widths that are different from those of Wafers 1 and 2 and that are dimensionally consistent with one another.

Figure 6:
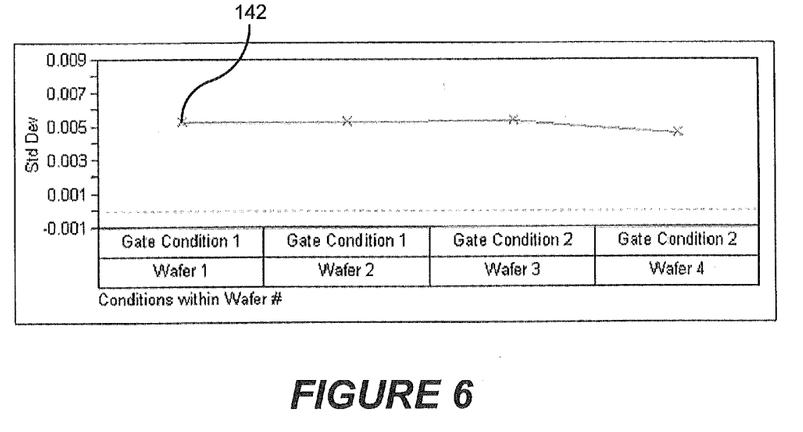
FIG. 6 is a graph illustrating standard deviation data corresponding to the data sets of FIG. 5.

Brief reference is now made to FIG. 6, which is a graph illustrating standard deviation data corresponding to the data sets of FIG. 5. The vertical axis of the graph corresponds to a standard deviation value. Thus, each standard deviation point 142 represents a standard deviation value of the corresponding width data set illustrated in FIG. 5. As illustrated, the standard deviation values of the different data sets indicate consistent levels of uniformity across all of the width data sets.

Figure 7:
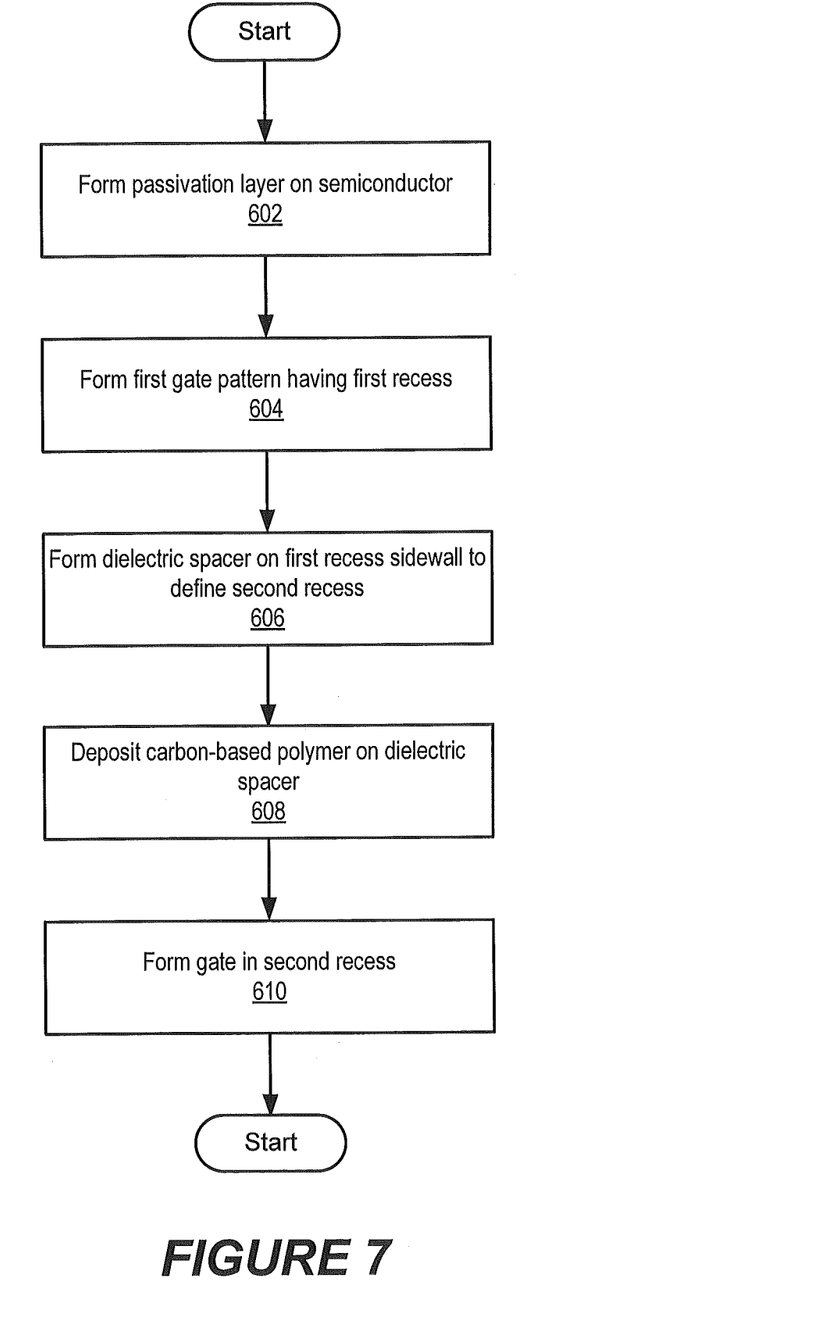
FIG. 7 is a flow chart illustrating operations according to some embodiments disclosed herein.

Reference is now made to FIG. 7, which is a flow chart illustrating operations according to some embodiments disclosed herein. In some embodiments, a passivation layer is deposited on the semiconductor (block 602). The passivation layer may be epitaxially deposited using one or more deposition processes. A first gate pattern may be formed on the semiconductor and/or passivation layer (block 604). The first gate pattern defines a first recess that includes a first width. In some embodiments, the first recess may be referred to as a preliminary recess and the first width may be greater than about 0.3 μm.

Some embodiments provide that the first gate pattern may be formed by forming a photolithography pattern on the semiconductor and/or passivation layer and stripping the photolithography pattern using a dry etch process. In some embodiments, the dry etch process includes a reactive ion etch process.

In embodiments that include the passivation layer, the preliminary recess may be formed in the passivation layer and may expose the semiconductor on which the passivation layer is deposited. A dielectric spacer is formed on a sidewall of the preliminary recess to define a second recess in the preliminary recess that has a second width that is smaller than the first width (block 606). Some embodiments provide that the second recess may be bounded by the dielectric spacer on a sidewall of the first recess and a bottom surface of the first recess. The second recess may be referred to as a gate recess and the second width may be less than about 0.25 μm. In some embodiments, the second width is in a range of about 0.05 μm to about 0.25 μm. In some embodiments, the second width is in a range of about 0.10 μm to about 0.20 μm.

Figure 8:
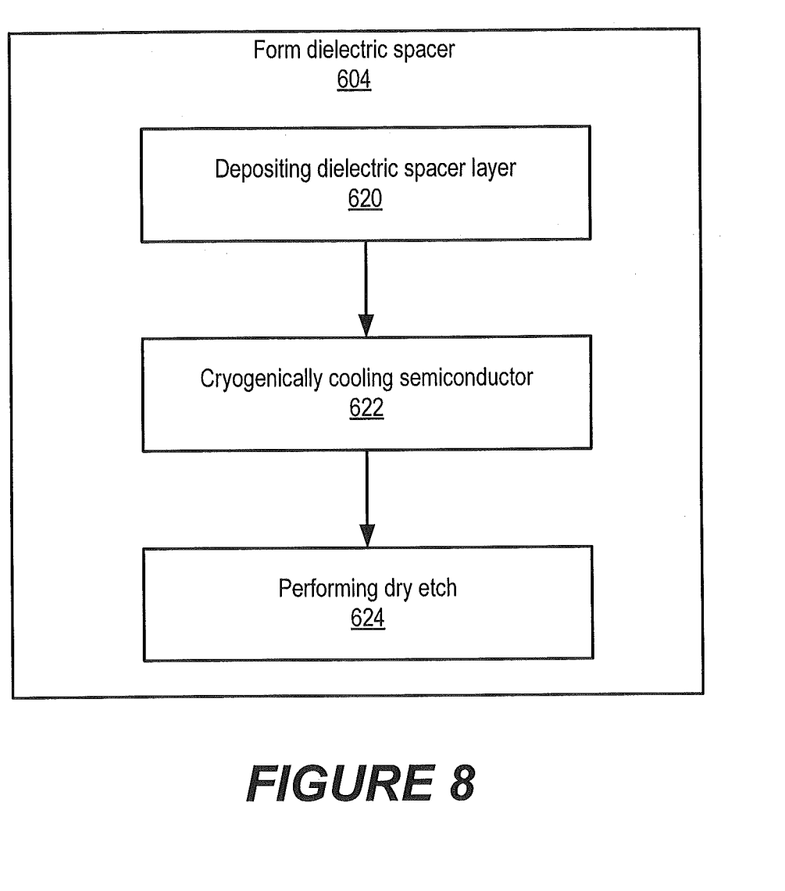
FIG. 8 is a flow chart illustrating operations for forming a dielectric spacer according to some embodiments disclosed herein.

Some embodiments provide that forming the dielectric spacer may be accomplished according to operations as illustrated in FIG. 8, which is a flow chart illustrating operations for forming a dielectric spacer according to some embodiments disclosed herein. Referring to FIG. 8, a dielectric spacer layer may be deposited on the semiconductor and/or passivation layer (block 620). The dielectric spacer layer may be formed on a top surface of the semiconductor and on surfaces of the first recess defined by the gate pattern. In some embodiments, the dielectric spacer layer may be deposited using plasma enhanced chemical vapor deposition and may include an oxide and/or a nitride. For example the dielectric spacer layer may include SiO and/or SiN, among others.

Some embodiments provide that a dry etch process is performed to remove the dielectric spacer layer from the top surface of the semiconductor and from a portion of the first recess to define the second recess (block 624). For example, a dry etch that includes a substantially small lateral etch property may be used to leave the dielectric spacer layer on the sidewalls of the preliminary recess to define a second recess having a reduced width. A gate and/or other feature that may be formed in the second recess may have a short width compared to conventional gates or features formed by photolithographic processes.

In some embodiments, the dielectric spacer layer may include SiO and the dry etch may be a fluorine dry reactive ion etch. Some embodiments provide that the dielectric spacer layer includes SiN and the dry etch may be a chlorine dry reactive ion etch. Although embodiments disclosed here expressly include fluorine and/or chlorine, the disclosure is not so limited. For example, etchants according to some embodiments may include any one of F, Cl, Br, I and/or At, among others.

In some embodiments, the semiconductor including the dielectric spacer layer may be cryogenically cooled (block 622) during the dry etch. The cryogenic cooling may reduce the temperature of the semiconductor, passivation layer, and/or dielectric spacer layer to a temperature corresponding to cryogenic temperatures such as, for example, a temperature corresponding to liquefied $N_2$. In this manner, the dry etch process is performed on the cryogenically cooled semiconductor. For example, some embodiments provide that the lateral etch of a SiN spacer in fluorine chemistry may be reduced by performing a fluorine dry etch at a cryogenically cooled temperature.

In some embodiments, relative chemistries and/or conditions for reducing lateral etch may be less available. In such embodiments, the spacer dielectric layer thickness may be increased from about half of the gate length to 25% to 50% more.

Referring back to FIG. 7, in some embodiments, a carbon based polymer may be deposited on the dielectric spacer (block 608). Some embodiments provide that the carbon base polymer may be deposited using a high C to F ratio halocarbon, such as halocarbon 318 ($C_4F_8$). Some embodiments provide that this gas may provide sidewall passivation in that there is little if any ion bombardment thereon and a reactive etchant on the bottom of the trench in which there may be substantially ion bombardment during the dry etch. Some embodiments provide that the carbon may be supplied through the introduction of carbon processing parts, such as a platter and/or clamps, among others. Regardless of how introduced, the carbon based polymer may slow the lateral etch of the SiN in fluorine.

A gate or other feature may be formed in the second recess (block 610). As the gate formed in the second recess having the second width, the gate may have the second width, which is less than the first width of the preliminary recess. In some embodiments, the gate may be formed by forming a gate oxide layer on a bottom surface of the second recess and forming a gate metallization pattern in the second recess.

In the drawings and specification, there have been disclosed typical embodiments of the invention, and although specific terms are employed, they are used in a generic and descriptive sense only and not for purposes of limitation, the scope of the invention being set forth in the following claims.

That which is claimed is:

1. A device comprising:
   a semiconductor including a gate recess that includes a bottom surface and a sidewall including a dielectric spacer that is formed on a sidewall of a preliminary recess, the gate recess including a recess width that is greater than about 0.05 µm;
   a carbon based polymer deposited on a side wall of the dielectric spacer; and
   a gate formed in the gate recess and having the recess width.

2. The device according to claim 1, wherein the preliminary recess comprises a width that is greater than about 0.3 µm.

3. The device according to claim 1, wherein the preliminary recess is formed using a dry etch process on a photolithography pattern on the semiconductor.

4. The device according to claim 1, wherein the recess width is in a range of about 0.10 µm to about 0.20 µm.

5. The device according to claim 1, further comprising a passivation layer on the semiconductor, wherein the gate recess is formed in the passivation layer and exposes the semiconductor therethrough.

6. The device according to claim 1, wherein the dielectric spacer includes a top surface that is lower than a height of a sidewall of the preliminary recess.

7. The device according to claim 1, wherein the dielectric spacer is formed from a dielectric spacer layer that comprises SiO and that is dry etched using a fluorine dry reactive ion etch and/or inductively coupled plasma.

8. The device according to claim 1, wherein the dielectric spacer is formed from a dielectric spacer layer that comprises SiN and that is dry etched using a chlorine dry reactive ion etch and/or inductively coupled plasma.

9. The device according to claim 1, wherein the gate comprises:
   a gate metallization pattern in the gate recess.

10. The device according to claim 2, wherein the preliminary recess comprises a width that is less than about 0.4 µm.

11. The device according to claim 1,
    wherein the gate comprises a width that is less than about 0.25 µm.

12. The device according to claim 1, wherein the gate includes a includes a gate oxide layer that includes a top surface that is higher than a bottom surface of the dielectric spacer relative to the semiconductor.

13. The device according to claim 1, wherein the gate comprises a gate oxide layer on a bottom surface of the gate recess.

14. A device comprising:
    a semiconductor including a gate recess that includes a bottom surface of a preliminary gate recess and a sidewall including a dielectric spacer that is formed on a sidewall of the preliminary recess, the gate recess including a recess width that is less than about 0.25 µm; and
    a carbon based polymer deposited on a side wall of the dielectric spacer using a fluorine carbon gas having a carbon to fluorine ratio greater than or equal to about 1:2.

15. The device according to claim 14, wherein the dielectric spacer includes a top surface that is lower than a height of a sidewall of the preliminary recess.

16. The device according to claim 14, wherein the dielectric spacer is formed from a dielectric spacer layer that comprises SiO and that is dry etched using a fluorine dry reactive ion etch and/or inductively coupled plasma.

17. The device according to claim 14, wherein the dielectric spacer is formed from a dielectric spacer layer that comprises SiN and that is dry etched using a chlorine dry reactive ion etch and/or inductively coupled plasma.

18. The device according to claim 14, further comprising a gate that is formed in the gate recess, wherein the gate comprises:
    a gate metallization pattern in the gate recess.

19. The device according to claim 14, wherein the gate recess includes the recess width that is greater than about 0.05 µm.

20. The device according to claim 14, wherein the carbon to fluorine ratio less than or equal to about 1:1.

21. A device comprising:
    a semiconductor including a first surface;
    a passivation layer that is on the first surface of the semiconductor; and
    a gate recess that is formed in the passivation layer and includes a bottom surface that is the first surface of the semiconductor and a sidewall including a dielectric spacer that is formed on a sidewall of a preliminary recess, the gate recess including a recess width that is toss than about 0.25 µm;
    a carbon based polymer deposited on a side wall of the dielectric spacer using a fluorine carbon gas; and
    a gate that is formed in the gate recess.

22. The device according to claim 21, wherein the gate comprises a gate oxide layer on the first surface of the semiconductor.

23. The device according to claim 21, wherein the gate recess includes the recess width that is greater than about 0.05 µm.

* * * * *

UNITED STATES PATENT AND TRADEMARK OFFICE
CERTIFICATE OF CORRECTION

| | |
|---|---|
| PATENT NO. | : 9,530,647 B2 |
| APPLICATION NO. | : 14/036799 |
| DATED | : December 27, 2016 |
| INVENTOR(S) | : Ring et al. |

Page 1 of 1

It is certified that error appears in the above-identified patent and that said Letters Patent is hereby corrected as shown below:

In the Claims

Column 9, Claim 12, Line 52: Please correct "includes a includes a gate" to read -- includes a gate --

Column 10, Claim 21, Line 44: Please correct "toss than" to read -- less than --

Signed and Sealed this
Twenty-seventh Day of June, 2017

Joseph Matal
*Performing the Functions and Duties of the*
*Under Secretary of Commerce for Intellectual Property and*
*Director of the United States Patent and Trademark Office*